US008667436B1

(12) United States Patent
Garlapati et al.

(10) Patent No.: US 8,667,436 B1
(45) Date of Patent: Mar. 4, 2014

(54) OBJECT IDENTIFICATION IN AN ELECTRONIC CIRCUIT DESIGN

(71) Applicant: Xilinx, Inc., San Jose, CA (US)

(72) Inventors: Krishna Garlapati, Campbell, CA (US); Elliot Delaye, San Jose, CA (US); Ashish Sirasao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/782,123

(22) Filed: Mar. 1, 2013

(51) Int. Cl.
*G06F 17/50* (2006.01)

(52) U.S. Cl.
CPC .......... *G06F 17/505* (2013.01); *G06F 17/5022* (2013.01)
USPC .............. 716/103; 716/104; 716/136; 703/15

(58) Field of Classification Search
CPC ...................... G06F 17/505; G06F 17/5022
USPC .............................. 716/103, 104, 136; 703/15
See application file for complete search history.

(56) References Cited

U.S. PATENT DOCUMENTS

| 7,293,247 | B1 * | 11/2007 | Newton et al. | 716/111 |
|---|---|---|---|---|
| 7,315,992 | B2 * | 1/2008 | Bhooshan et al. | 716/112 |
| 7,895,558 | B2 * | 2/2011 | Roesner et al. | 716/116 |
| 7,913,216 | B2 * | 3/2011 | Chan et al. | 716/119 |
| 7,921,399 | B2 * | 4/2011 | Berry et al. | 716/130 |
| 8,020,123 | B2 * | 9/2011 | Wilson | 716/106 |
| 8,225,262 | B1 * | 7/2012 | Tom et al. | 716/122 |
| 8,386,990 | B1 * | 2/2013 | Trimberger et al. | 716/136 |
| 8,397,186 | B2 * | 3/2013 | Brubaker | 716/106 |
| 8,438,531 | B2 * | 5/2013 | Majumder et al. | 716/139 |
| 8,443,317 | B2 * | 5/2013 | Hiraoglu et al. | 716/107 |
| 8,453,088 | B2 * | 5/2013 | Akar et al. | 716/112 |
| 8,464,202 | B2 * | 6/2013 | Boshart et al. | 716/139 |
| 8,516,418 | B2 * | 8/2013 | Singh et al. | 716/106 |
| 8,549,461 | B2 * | 10/2013 | Huijbregts et al. | 716/129 |
| 2013/0144589 | A1 * | 6/2013 | Levi | 703/14 |

* cited by examiner

*Primary Examiner* — Phallaka Kik
(74) *Attorney, Agent, or Firm* — LeRoy D. Maunu; Lois D. Cartier

(57) ABSTRACT

The disclosure describes approaches for processing a circuit design. For each object of a plurality of objects of the circuit design, a respective key is generated as a function of a plurality of configuration parameter values of the object. Each object is renamed with a unique name that includes the key. A netlist of the circuit design is generated using the unique names and keys of the objects.

20 Claims, 4 Drawing Sheets

US 8,667,436 B1

OBJECT IDENTIFICATION IN AN ELECTRONIC CIRCUIT DESIGN

TECHNICAL FIELD

The disclosure generally relates to tools for preparing electronic circuit designs.

BACKGROUND

Increases in sizes of electronic system circuit designs have accompanied advances in circuit integration. One way in which electronic design automation tools have attempted to meet the challenges of large designs is with hierarchical design flows. In a hierarchical design flow the design is partitioned into portions that are easier to manage. The portions may be separately compiled, simulated, and debugged, and then subsequently combined into a complete system.

The process of combining a number of portions of a design into the complete design may be error prone. Errors may be introduced through inadvertently giving different objects the same name. Since connectivity between elements in a netlist is implied by the names of the elements, assigning the same name to an object in one portion of the design and to another object in a separately compiled portion of the design would likely produce undesirable results when the portions are combined.

SUMMARY

A method of processing a circuit design includes, for each object of a plurality of objects of the circuit design, generating a respective key as a function of a plurality of configuration parameter values of the object. Each object is renamed with a unique name that includes the key. A netlist of the circuit design is generated using the unique names and keys of the objects.

A system for processing a circuit design includes a processor and a memory coupled to the processor. The memory is configured with instructions that when executed by the processor cause the processor to perform operations including, for each object of a plurality of objects of the circuit design, generating a respective key as a function of a plurality of configuration parameter values of the object. Each object is renamed with a unique name that includes the key. A netlist of the circuit design is generated using the unique names and keys of the objects.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings, in which.

DETAILED DESCRIPTION

In this disclosure, objects of an electronic circuit design are assigned unique names during compilation of the design. In one aspect, a key is generated for each object based on the configuration parameter values of the object. The key is combined with the user-specified name of the object to create a unique identifier for the object. Once objects have been uniquely named, a netlist of the design may be generated.

In another aspect, the keys may be used to enable reuse of previously compiled objects. For example, once the netlist for an object has been generated, if during the compilation process another object is encountered having the same key as the previously compiled object, the netlist of the previously compiled object may be reused for the second object, thereby saving compilation time.

The keys may also be useful when combining netlists of separate portions of a circuit design. If two objects have the same name but different keys, one of the objects may be automatically renamed to a unique name while retaining the keys for both objects. In some implementations, the keys may be further used to represent in compact form the configuration parameter values of the objects. Using a reversible hash, the inverse of the hash function may be applied post-synthesis to a key to view the values of the configuration parameters of the object.

Figure 1:
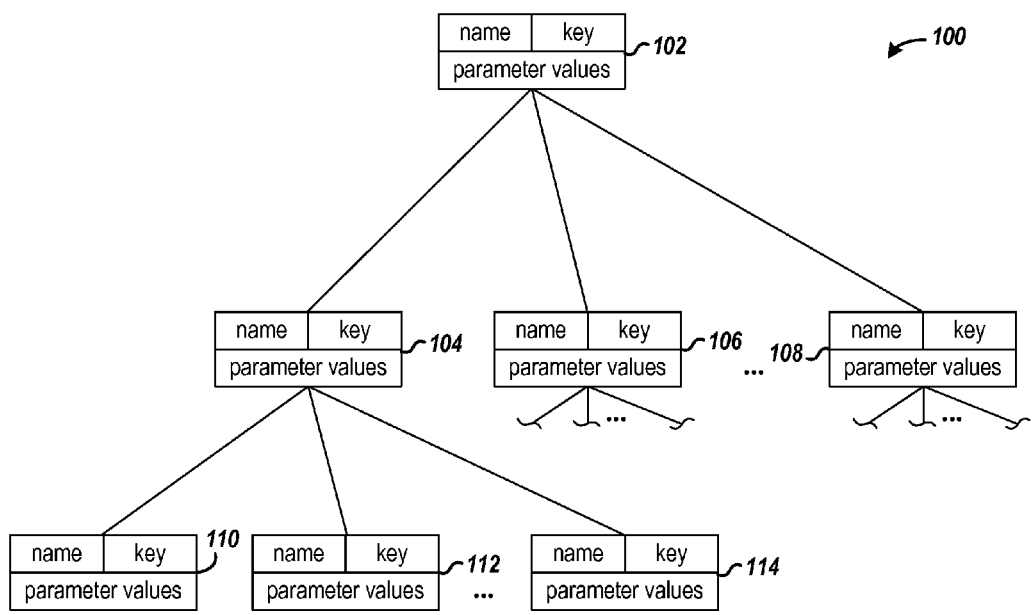
FIG. 1 shows an example hierarchy of objects of a circuit design.

FIG. 1 shows an example hierarchy 100 of objects of a circuit design. The example hierarchy has three levels. Object 102 is at the top level, objects 104, 106, . . . , 108 are in a middle level, and objects 110, 112, and 114 are at the lowest level. Object 102 has constituent objects 104, 106, . . . , 108, and object 104 has constituent objects 110, 112, . . . , 114. Objects 106 and 108 may have constituent objects which are not shown.

In an example development scenario, the portions of the design represented by objects 104, 106, . . . , 108 may be separately developed, such as by separate design teams. Naming conflicts may arise as between the objects 104, 106, . . . , 108 since detailed naming coordination between teams may not be possible or a priority. When the designs of objects 104, 106, . . . , 108 are brought together for final assembly, there may be duplicate names between two or more of the objects.

Each object has a designer-specified name, designer-specified parameter values that configure the object, and a key whose value is a function of the parameter values. During synthesis of the design (or a portion thereof), a key is established for each object. Each key is generated as a function of the parameter values for the object. For example, the parameters and values may be used as input to a hash function, which generates a hash value to be used as the key. The key of each object is then associated with the object, and the object name and key may be used in conjunction as an object identifier. For example, the name and a character string representation of the key may be concatenated.

As a concrete example, a counter may be an object in a circuit design. The counter may have parameters for specifying the size in bits (input width and output width); counting up, down, or up and down; a final count value; an initial value; and an increment/decrement amount, for example. For other objects, configuration parameters may include clock frequency, timing constraints, and/or other implementation-specific parameters for example.

The hash function uses the name and type of the object (e.g., counter) and the parameter values in generating a key for the object. Two objects of the same type and name have the same key if the objects have the same parameter values. Two different objects with the same type and name would be uniquely identified, however, since the objects would have different key-based names. The compiler would flag an error for two objects of the different type or parameters having the same name.

The hash function may be non-reversible or reversible depending on application requirements. If protection of the parameters and parameter values is desirable, a non-reversible hash function may be used to hide the parameters and parameter values from those lacking proper authorization. A reversible hash function may be useful for debugging purposes. For example, in simulating the design it may be useful to be able for the designer to view the parameter values of different objects. With a reversible hash, the inverse function of the hash may be applied to the key, and the result would indicate the type of the object, the parameters, and the parameter values. In another implementation, the hash function may be a cryptographic hash function.

Figure 2:
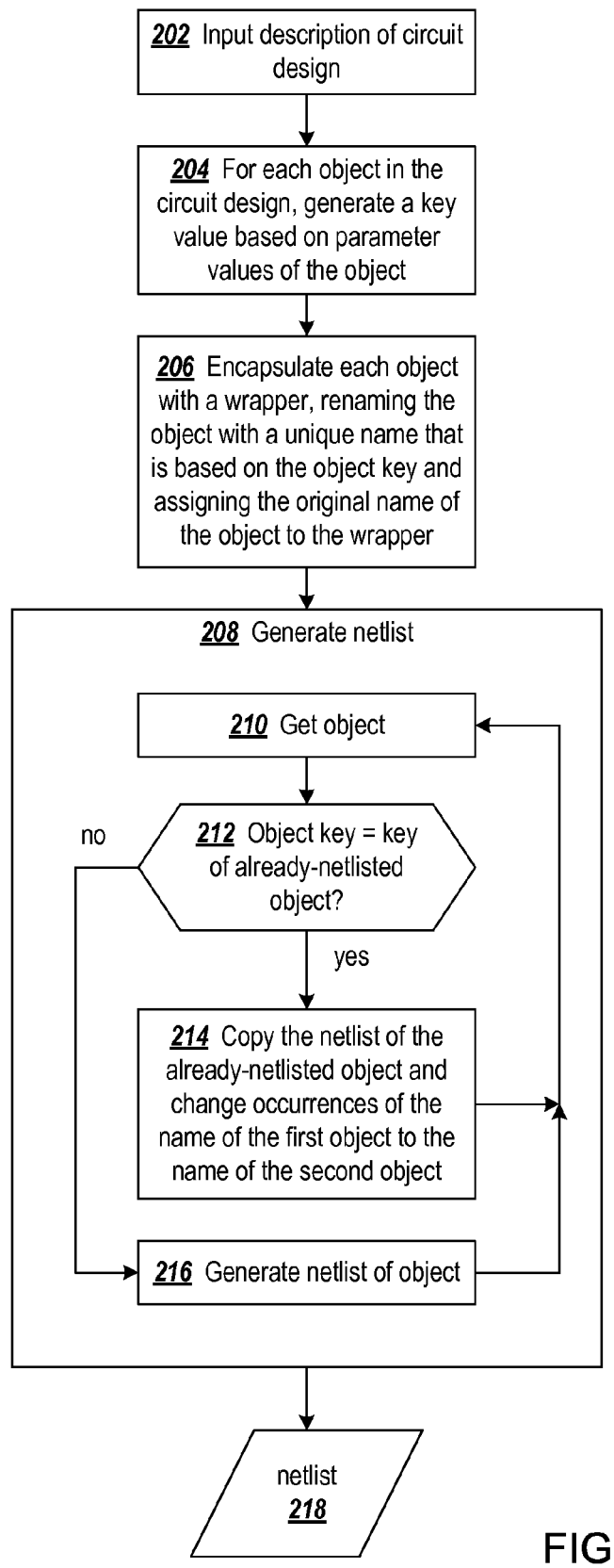
FIG. 2 is a flowchart of a process for generating a netlist of a circuit design.

FIG. 2 is a flowchart of a process for generating a netlist of a circuit design. A description of the design is input at block 202. The description may be expressed in a hardware description language (HDL) such as VHDL, Verilog, or register transfer language (RTL). At block 204, a key is generated for each object in the circuit design. Such objects include, for example, modules described in an HDL and intellectual property logic cores ("IP cores") instantiated in the design. The key is generated based on values of configuration parameters of the object, and as described above, a hash function may be used to generate the key.

As an optional part of the process, each object may be encapsulated in a wrapper as shown in block 206. The wrapper of an object is given the original name of the object in order to preserve visibility of the object to the designer, which may be useful for simulation and debugging. The object itself is assigned a unique name that is based on the original name and the generated key.

At block 208, a netlist of the design (or a portion thereof) is generated. The generation of the netlist includes getting an object of the design at block 210, and checking at block 212 whether or not the key of that object matches the key of an object for which a netlist has already been generated. Partial netlists may have been previously generated and stored in a database for selected objects that are commonly used. These partial netlists may be indexed by keys that are generated as described above, and the database may be provided as part of the synthesis tool. In combination therewith, as partial netlists are generated for objects of the design, the generated partial netlists may be added to the database and reused for other objects having matching keys.

If the key of the in-process object matches that of another object for which a netlist has already been generated, then the partial netlist of that other object may be reused for the in-process object. At block 214, the partial netlist of the other object is retrieved from the database, and a copy is made of the partial netlist. In the copied netlist, occurrences of the name of the other object are changed to the name of the in-process object. Control is returned to block 210 to get the next object to process.

If the key of the in-process object does not match the key of a previously processed object, block 212 directs the process to block 216 where a partial netlist is generated for the in-process object. The processing of both blocks 214 and 216 includes merging the generated partial netlist with those partial netlists generated for other objects of the design. The process then returns to get the next object to process. The processing of block 208 continues until all objects of the design have been processed. The generated netlist 218 may be stored in non-volatile storage for further processing.

Figure 3:
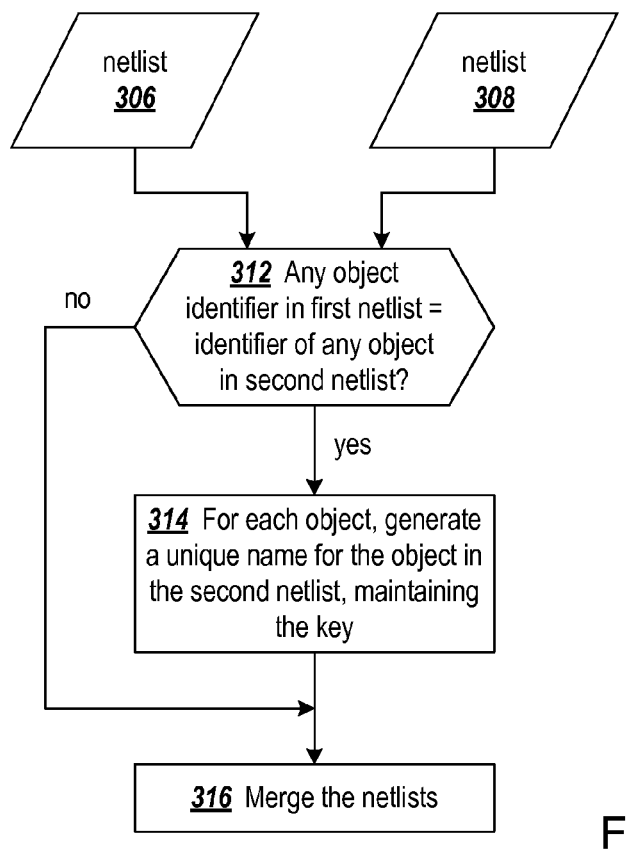
FIG. 3 is a flowchart of a process for merging separately generated netlists.

FIG. 3 is a flowchart of a process for merging separately generated netlists. In an example scenario, netlists 306 and 308 may have been separately generated by separate teams working on different parts of an overall circuit design. The process checks at decision block 312 whether or not any object identifier in the first netlist matches the identifier of an object in the second netlist. The identifiers will match if the same names were given to the objects and the keys of the objects are equal. That is, if the same type of object was assigned the same name and the same configuration parameter values in both parts of the design, the object identifiers in the netlists 306 and 308 will match.

For objects having matching names but different keys, the process is directed to block 314. For each object having a matching name, a unique name is generated for the object in the second netlist. The key values of the objects are maintained since the configuration parameter values of the objects do not change. Once objects have been renamed, if necessary, the netlists are merged at block 316.

Figure 4:
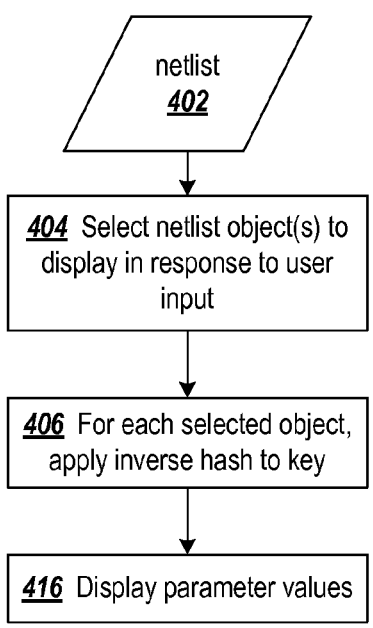
FIG. 4 is a flowchart of a process for displaying the parameter values of an object for which a key has been generated.

FIG. 4 is a flowchart of a process for displaying the parameter values of an object for which a key has been generated. During simulation and debugging activities, it may be useful for the designer to easily reference the configuration parameter values of selected objects. However, once compiled into a netlist in prior approaches, the configuration parameter values are not visible. To view the configuration parameter values, the designer would have to reference the original HDL specification, which may be cumbersome. Since in this disclosure the keys of objects are generated based on the configuration parameter values, with a reversible hash function, the configuration parameter values may be readily available to the designer.

Based on an input netlist 402 and user input, an object of the netlist is selected at block 404. Since the identifiers of the objects include the keys of the objects, the key can be extracted from the identifier of the selected object. At block 406, the inverse of the hash function, which was used to generate the key, is applied to the key. The result of the inverse hash function provides an indication of the configuration parameter values. It will be recognized that different portions of the result may be mapped to particular parameters and parameter values. At block 416, the parameter values are displayed to the user.

Figure 5:
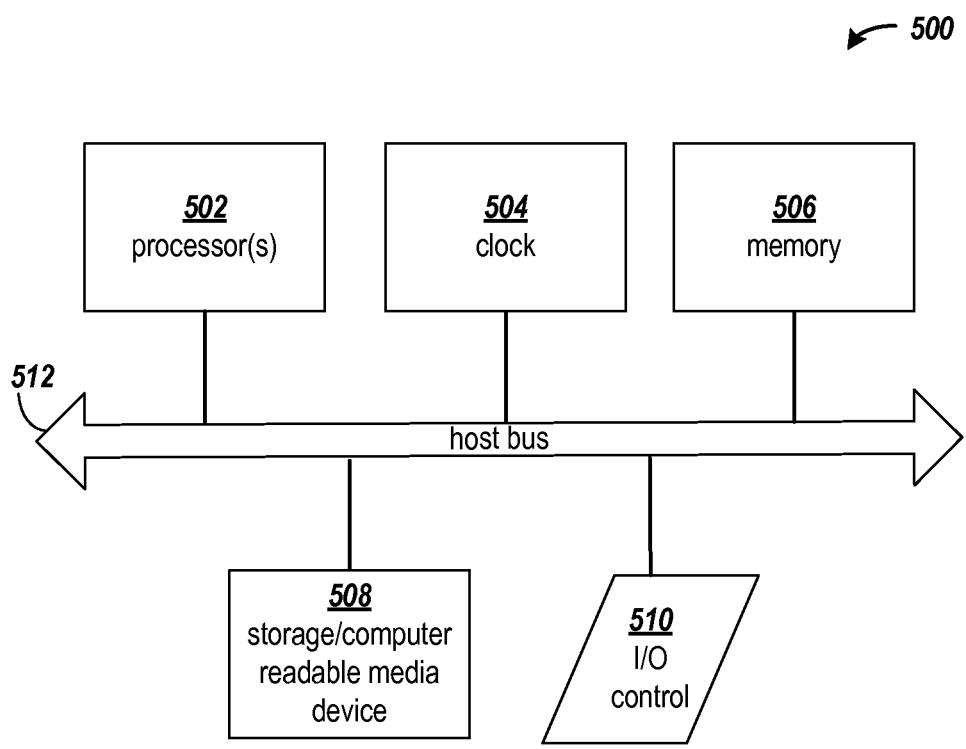
FIG. 5 shows a block diagram of an example computing arrangement that may be configured to implement the data structures and processes described herein.

FIG. 5 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory arrangement 506, a storage arrangement 508, and an input/output control unit 510, all coupled to a host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements, as would be recognized by those skilled in the art. The processor(s) 502 may be one or more general purpose processors, or a combination of one or more general purpose processors and suitable co-processors, or one or more specialized processors (e.g., RISC, CISC, pipelined, etc.).

The memory arrangement 506 typically includes multiple levels of cache memory, and a main memory. The storage arrangement 508 may include local and/or remote persistent storage, such as provided by magnetic disks (not shown), flash, EPROM, or other non-volatile data storage. The storage unit may be read or read/write capable. Further, the memory arrangement 506 and storage arrangement 508 may be combined in a single arrangement.

The processor(s) 502 executes the software in storage arrangement 508 and/or memory arrangement 506, reads data from and stores data to the storage arrangement 508 and/or memory arrangement 506, and communicates with external devices through the input/output control arrangement 510. These functions are synchronized by the clock signal generator 504. The resource of the computing arrangement may be managed by either an operating system (not shown), or a hardware control unit (not shown).

Though certain features may in some cases be described in individual figures, it will be appreciated that the features from one figure can be combined with features of another figure even though the combination is not explicitly shown or explicitly described as a combination.

The methods and system described herein are thought to be applicable to a variety of systems for synthesizing circuit designs. Other aspects will be apparent to those skilled in the art from consideration of the specification. It is intended that the specification and illustrated embodiments be considered as examples only, with a true scope of the invention being indicated by the following claims.

What is claimed is:

1. A method of processing a circuit design, comprising:
   for each object of a plurality of objects of the circuit design:
      generating, using a processor, a respective key as a function of a plurality of configuration parameter values of the object; and
      renaming the object with a unique name that includes the key; and
   generating a netlist of the circuit design using the unique names and keys of the objects.

2. The method of claim 1, wherein the generating of the netlist includes:
   generating a first partial netlist of the circuit design from a first object of the circuit design, the first object having a first name; and
   in response to the generated key for a second object being equal to the generated key of the first object, the second object having a second name, creating a copy of the first partial netlist, and changing occurrences of the first name in the copy of the first partial netlist to the second name.

3. The method of claim 1, wherein the generating of the netlist includes:
   generating a first partial netlist of the circuit design from a first plurality of objects of the circuit design;
   generating a second partial netlist of the circuit design from a second plurality of objects of the circuit design;
   determining whether any first object in the first partial netlist has a name equal to a name of any second object in the second partial netlist; and
   in response to determining that the name of the first object is equal to the name of the second object, renaming the second object with a name that is unique from the name of the first object and including the key of the second object.

4. The method of claim 1, wherein the generating of the respective key value includes computing a non-reversible hash function on the plurality of configuration parameter values of the object.

5. The method of claim 1, wherein the generating of the respective key value includes computing a reversible hash function on the plurality of configuration parameter values of the object.

6. The method of claim 1, wherein the generating of the respective key value includes computing a cryptographic hash function on the plurality of configuration parameter values of the object.

7. The method of claim 6, further comprising:
   decrypting the key value of an object name of a selected object; and
   displaying the plurality of configuration parameter values of the selected object.

8. The method of claim 1, wherein each object has an original name, the method further comprising for each object of a plurality of objects:
   generating a wrapper for the object; and
   assigning the original name of the object to the wrapper.

9. The method of claim 1, wherein the configuration parameter values include one or more of an input width, an output width, an initial value, a frequency, a timing constraint or an implementation-specific parameter.

10. The method of claim 1, wherein the generating of the netlist includes, for each object:
   searching a database for the key of the object, the database having keys and associated partial netlists;
   in response to finding the key of the object in the database, retrieving the partial netlist associated with the key; and
   combining the partial netlist retrieved from the database with the netlist.

11. A system for processing a circuit design, comprising:
   a processor; and
   a memory coupled to the processor, wherein the memory is configured with instructions that when executed by the processor cause the processor to perform operations including:
      for each object of a plurality of objects of the circuit design:
         generating a respective key as a function of a plurality of configuration parameter values of the object; and
         renaming the object with a unique name that includes the key; and
      generating a netlist of the circuit design using the unique names and keys of the objects.

12. The system of claim 11, wherein the generating of the netlist includes:
   generating a first partial netlist of the circuit design from a first object of the circuit design, the first object having a first name; and
   in response to the generated key for a second object being equal to the generated key of the first object, the second object having a second name, creating a copy of the first partial netlist, and changing occurrences of the first name in the copy of the first partial netlist to the second name.

13. The system of claim 11, wherein the generating of the netlist includes:
  generating a first partial netlist of the circuit design from a first plurality of objects of the circuit design;
  generating a second partial netlist of the circuit design from a second plurality of objects of the circuit design;
  determining whether any first object in the first partial netlist has a name equal to a name of any second object in the second partial netlist; and
  in response to determining that the name of the first object is equal to the name of the second object, renaming the second object with a name unique from the name of the first object and including the key of the second object.

14. The system of claim 11, wherein the generating of the respective key value includes computing a non-reversible hash function on the plurality of configuration parameter values of the object.

15. The system of claim 11, wherein the generating of the respective key value includes computing a reversible hash function on the plurality of configuration parameter values of the object.

16. The system of claim 11, wherein the generating of the respective key value includes computing a cryptographic hash function on the plurality of configuration parameter values of the object.

17. The system of claim 16, the operations further including:
  decrypting the key value of an object name of a selected object; and
  displaying the plurality of configuration parameter values of the selected object.

18. The system of claim 11, wherein each object has an original name, the operations further including, for each object of a plurality of objects:
  generating a wrapper for the object; and
  assigning the original name of the object to the wrapper.

19. The system of claim 11, wherein the configuration parameter values include one or more of an input width, an output width, an initial value, a frequency, a timing constraint or an implementation-specific parameter.

20. The system of claim 11, wherein the generating of the netlist includes, for each object:
  searching a database for the key of the object, the database having keys and associated partial netlists;
  in response to finding the key of the object in the database, retrieving the partial netlist associated with the key; and
  combining the partial netlist retrieved from the database with the netlist.

* * * * *

UNITED STATES PATENT AND TRADEMARK OFFICE
CERTIFICATE OF CORRECTION

PATENT NO. : 8,667,436 B1  Page 1 of 1
APPLICATION NO. : 13/782123
DATED : March 4, 2014
INVENTOR(S) : Garlapati et al.

It is certified that error appears in the above-identified patent and that said Letters Patent is hereby corrected as shown below:

On the title page of the patent, item (72), inventor "Elliot Delaye" should read -- Elliott Delaye --.

Signed and Sealed this
Thirteenth Day of May, 2014

Michelle K. Lee
*Deputy Director of the United States Patent and Trademark Office*